(12) United States Patent
Goh et al.

(10) Patent No.: US 11,192,782 B1
(45) Date of Patent: Dec. 7, 2021

(54) METHOD FOR PREPARING SILICON WAFER WITH ROUGH SURFACE AND SILICON WAFER

(71) Applicant: AAC ACOUSTIC TECHNOLOGIES (SHENZHEN) CO., LTD., Shenzhen (CN)

(72) Inventors: Wooicheang Goh, Singapore (SG); Lieng Loo, Singapore (SG); Kahkeen Lai, Singapore (SG)

(73) Assignee: AAC ACOUSTIC TECHNOLOGIES (SHENZHEN) CO., LTD., Shenzhen (CN)

( * ) Notice: Subject to any disclaimer, the term of this patent is extended or adjusted under 35 U.S.C. 154(b) by 0 days.

(21) Appl. No.: 17/009,753

(22) Filed: Sep. 1, 2020

(51) Int. Cl.
*B81C 1/00* (2006.01)
*B81B 3/00* (2006.01)

(52) U.S. Cl.
CPC ........ *B81C 1/00968* (2013.01); *B81B 3/0008* (2013.01); *B81B 3/0013* (2013.01); *B81B 3/0016* (2013.01); *B81B 2201/0235* (2013.01); *B81C 1/00984* (2013.01); *B81C 1/00992* (2013.01); *B81C 2201/11* (2013.01); *B81C 2201/115* (2013.01)

(58) Field of Classification Search
CPC .......... B81C 1/00968; B81C 2201/115; B81C 2201/11; B81C 1/00952; B81C 1/00984; B81C 1/00992; B81B 3/0008; B81B 2201/0235; B81B 3/0013; B81B 3/0016
See application file for complete search history.

(56) References Cited

U.S. PATENT DOCUMENTS

| 6,391,708 B1* | 5/2002 | Liao | ........................ | H01L 28/92 438/253 |
| 2018/0272287 A1* | 9/2018 | Kennedy | ............ | B01D 67/0065 |
| 2019/0016592 A1* | 1/2019 | Stehle | ................. | B81C 1/00333 |

OTHER PUBLICATIONS

Belov ("Local Etching of Silicon Using a Solid Mask from Porous Aluminum Oxide," Semiconductors, 2008, vol. 42, No. 13, pp. 1519-1521, 2008) (Year: 2008).*

* cited by examiner

*Primary Examiner* — Yasser A Abdelaziez
(74) *Attorney, Agent, or Firm* — W&G Law Group

(57) ABSTRACT

Provided are a method for preparing a silicon wafer with a rough surface and a silicon wafer, for solving the problem that a viscous force is likely to be generated when a smooth surface of the silicon wafer approaches another film layer. The method includes: depositing a porous oxide film layer on a surface of the first silicon planar layer that has been subjected to planar planarization, and then etching the porous oxide film layer by $XeF_2$ vapor etching, during which $XeF_2$ gas passes through the porous oxide film layer to etch the first silicon planar layer in an irregular way. Therefore, the first silicon planar layer has a greater surface roughness. When the silicon wafer approaches to another film layer, the viscous force generated therebetween is reduced, improving the sensitivity of the MEMS device and reducing the probability of out-of-work MEMS devices.

9 Claims, 7 Drawing Sheets

METHOD FOR PREPARING SILICON WAFER WITH ROUGH SURFACE AND SILICON WAFER

FIELD

The invention relates to the technical field of silicon wafers, and particularly, to a method for preparing a silicon wafer with a rough surface and a silicon wafer.

BACKGROUND

The technology of Micro Electro Mechanical Systems (MEMS) is known as a revolutionary and interdisciplinary high-tech in the 21st century, which combines microelectronics and micromachines and well developed since 1960. Such a relatively new technology will have revolutionary impacts on human life in the future due to its various advantages such as microminiaturization, intelligence, executability, and capable of being integrated, good process compatibility and low cost, etc. Therefore, it has been widely used in many fields. For example, MEMS accelerators are commonly used in automobiles (for example, in airbag systems), tablet computers or smartphones.

MEMS devices are micromechanical devices that provide moving parts having a dimension less than 100 µm. These moving parts are formed with micromachining technology. The MEMS devices have holes, cavities, channels, cantilevers, membranes, etc. These devices are usually based on silicon materials (such as crystalline silicon wafers), with their physical structures formed by various techniques, and release these structures for movement.

In the preparation of the MEMS devices, when two surfaces having an area below a micron scale are very close to each other, due to static electricity and/or Van der Waals' force, the two surfaces may stick together to generate a viscous force which may reduce sensitivity of the device, for example, cause the parts in the MEMS device (for example, a rocker accelerometer) to freeze in place and become unusable. The MEMS devices known in the prior art are usually based on crystalline silicon wafers, whose surfaces are relatively smooth, i.e., with small surface roughness. However, when the smooth surface of the crystalline silicon wafer is close to another film layer, the two surfaces approaching each other are prone to generate a viscous force, which reduces the sensitivity of the MEMS device, and even makes the parts of the MEMS device immobile and unusable.

SUMMARY

In view of the above, embodiments of the present invention provide a method for preparing a silicon wafer with a rough surface and a silicon wafer, in order to solve the problems in the prior art, i.e., the smooth surface of the silicon wafer and a surface of another film layer approaching each other are prone to generate a viscous force, which reduces the sensitivity of the MEMS device and even makes the parts of the MEMS device immobile and unusable.

An embodiment of the present invention provides a method for preparing a silicon wafer with a rough surface, comprising: forming a substrate, wherein the substrate has a first region, a second region, and a third region along a first direction, and the first direction is perpendicular to a thickness direction of the substrate; depositing a first silicon layer on the substrate in the second region; depositing a dielectric layer on the substrate in the first region and the third region and on a side of the first silicon layer facing away from the substrate; performing planar planarization on the dielectric layer to expose the first silicon layer and to form a dielectric planar layer and a first silicon planar layer; depositing a porous oxide film layer on a side of the first silicon planar layer facing away from the substrate; performing a first etching on the porous oxide film layer and the first silicon planar layer by means of $XeF_2$ vapor etching; and removing the porous oxide film layer.

In an embodiment, the method further includes: after said removing the porous oxide film layer, performing a second etching on the first silicon planar layer that has been subjected to the first etching to form grooves on a surface, facing away from the substrate, of the first silicon planar layer.

In an embodiment, a thickness of the porous oxide film layer is smaller than a thickness of the first silicon planar layer.

In an embodiment, the thickness of the porous oxide film layer ranges from 0.05 µm to 0.6 µm, and the thickness of the first silicon planar layer ranges from 1 µm to 4 µm.

In an embodiment, said removing the porous oxide film layer comprises: removing the porous oxide film layer by dry etching or wet etching.

In an embodiment, said depositing the porous oxide film layer on the side of the first silicon planar layer facing away from the substrate comprise: chemically or physically depositing the porous oxide film layer on the side of the first silicon planar layer facing away from the substrate.

In an embodiment, said performing planar planarization on the dielectric layer and the first silicon layer comprises: performing chemical mechanical planarization on the dielectric layer and the first silicon layer.

In an embodiment, said performing a second etching on the first silicon planar layer that has been subjected to the first etching: performing ion etching or wet etching on the first silicon planar layer that has been subjected to the first etching.

An embodiment of the present invention provides a silicon wafer. The silicon wafer includes: a substrate, wherein the substrate has a first region, a second region, and a third region along a first direction, the first direction is perpendicular to a thickness direction of the substrate; a dielectric planar layer disposed on the substrate and located in the first region and the third region; and a first silicon planar layer disposed on the substrate and located in the second region. The silicon wafer is prepared by the method for preparing a silicon wafer with a rough surface as described above.

According to the present invention, in the method for preparing a silicon wafer with a rough surface, the porous oxide film layer is deposited on the surface of the silicon that has been subjected to planar planarization and then the first etching is performed on the first silicon planar layer with $XeF_2$ vapor etching, during which $XeF_2$ gas passes through the porous oxide film layer to etch the first silicon planar layer for the first time. Since $XeF_2$ has a very low efficiency in removing oxide, when $XeF_2$ gas passes through the porous oxide film layer to etch the first silicon planar layer, the first silicon planar layer is etched in an irregular way. Therefore, the first silicon planar layer that has been subjected to the first etching has a greater surface roughness. That is, compared with the smooth surface of the first silicon planar layer that has not been the first etching, the surface of the first silicon planar layer that has been subjected to the first etching is a rough surface. When the silicon wafer prepared by this method is applied to the MEMS device, the rough surface is maintained all the time. Therefore, when the silicon wafer is close to another film layer, the viscous force generated between two surfaces approaching each other is reduced, hereby improving the sensitivity of the MEMS device and reducing the probability of the out-of-work MEMS devices.

BRIEF DESCRIPTION OF DRAWINGS

Many aspects of the exemplary embodiment can be better understood with reference to the following drawings. The components in the drawings are not necessarily drawn to scale, the emphasis instead being placed upon clearly illustrating the principles of the present invention. Moreover, in the drawings, like reference numerals designate corresponding parts throughout the several views.

DESCRIPTION OF EMBODIMENTS

In order to explain the present invention, the embodiments of the present invention will be described in detail below with reference to the accompanying drawings.

It should be understood that the described embodiments are only a part of, but not all of the embodiments of the present invention. Based on the embodiments described in the present invention, all other embodiments, which are obtained by those skilled in the art without paying creative efforts, shall fall within the protection scope of the present invention.

The terms used in the embodiments of the present invention are merely for the purpose of describing specific embodiments, but not intended to limit the present invention. The singular forms "a", "an", "said" and "the" used in the embodiments of the present invention and the appended claims are also intended to include the plural forms thereof, unless the context clearly indicates otherwise.

It should be understood that the term "and/or" used herein is merely an association relationship describing associated objects, indicating that there may be three relationships. For example, A and/or B may indicate: A exists alone, both A and B exist, and B exists alone. In addition, the character "/" generally indicates that the related objects are in an "or" relationship.

Figure 1:
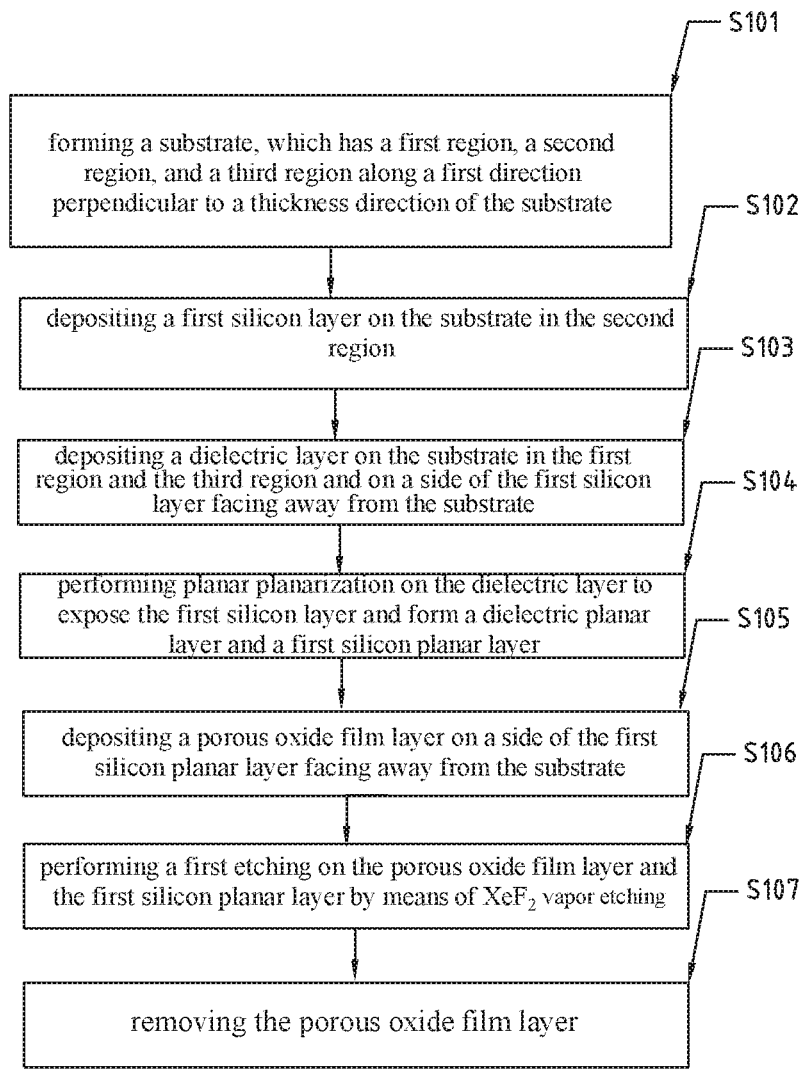
FIG. 1 is a flow diagram of a method for preparing a silicon wafer with a rough surface according to an embodiment of the present invention.

FIG. 1 is a flow diagram of a method for preparing a silicon wafer with a rough surface provided by an embodiment of the present invention. As shown in FIG. 1, the method for preparing a silicon wafer with a rough surface includes the following steps S101 to S107.

Step S101: a substrate is formed. The substrate includes a first region, a second region, and a third region in a first direction, and the first direction is perpendicular to a thickness direction of the substrate.

Step S102: a first silicon layer is deposited on the surface of the substrate in the second region.

Step S103: a dielectric layer is deposited on the substrate in the first region and the third region and on a side of the first silicon layer facing away from the substrate.

Figure 2:
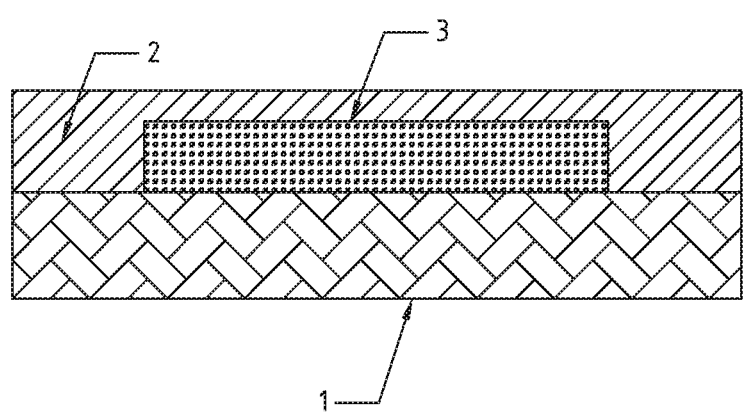
FIG. 2 is a structural schematic diagram of a silicon wafer after step S103 in the method shown in FIG. 1.

FIG. 2 illustrates the structure of the silicon wafer after the dielectric layer and the first silicon layer are deposited on the substrate 1.

That is, a dielectric layer 2 is deposited in the first region and the third region of the substrate 1, and a first silicon layer 3 is deposited in the second region of the substrate 1.

The dielectric layer 2 and the first silicon layer 3 are located in the same layer and are separately deposited, and the dielectric layer 2 and the first silicon layer 3 both have an uneven thickness after the deposition. Thus, the dielectric layer 2 and the first silicon layer 3 are required to be planarized, as performed in step S104.

Figure 3:
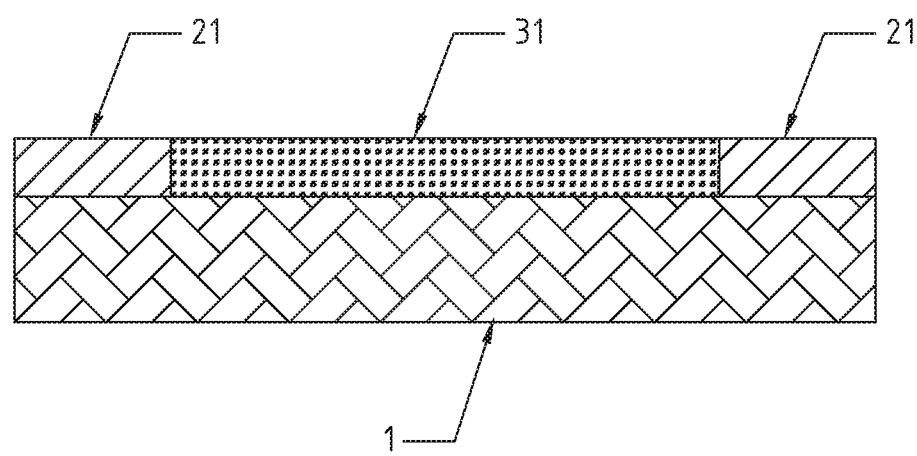
FIG. 3 is a structural schematic diagram of a silicon wafer after step S104 in the method shown in FIG. 1.

Step S104: a planar planarization is performed on the dielectric layer 2 to expose the first silicon layer 3 and to form a dielectric planar layer 21 and a first silicon planar layer 31. FIG. 3 illustrate the structure after the dielectric layer 2 and the first silicon layer 3 are subjected to the planar planarization. At this time, each of the dielectric planar layer 21 and the first silicon planar layer 31 has an even thickness, and the thickness of the dielectric planar layer 21 is the same as the thickness of the first silicon planar layer 31.

However, although the dielectric planar layer 21 and the first silicon planar layer 31 have the even thickness after the planar planarization, a surface of the first silicon planar layer 31 facing away from the substrate 1 has a relatively smaller roughness. That is, the surface of the first crystalline silicon planar layer 31 facing away from the substrate 1 is relatively smooth. In this case, if the silicon wafer approaches another film layer in order to prepare a MEMS device, the two surfaces approaching each other are still prone to generate a viscous force, which reduces the sensitivity of the MEMS device, and even makes the components of the MEMS device immobile and unusable. In this regard, the silicon wafer is required to be roughened, i.e., the surface of the first silicon planar layer 31 facing away from the substrate 1 needed to be roughened, as performed in step S105 and step S106.

Figure 4:
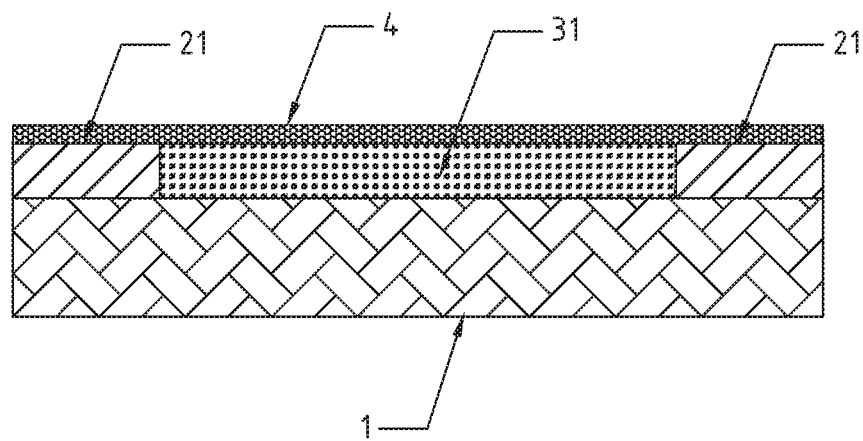
FIG. 4 is a structural schematic diagram of a silicon wafer after step S105 in the method shown in FIG. 1.

Step S105: a porous oxide film layer is deposited on a side of the first silicon planar layer facing away from the substrate. As shown in FIG. 4, the porous oxide film layer 4 is formed on a surface of the first silicon planar layer 31 facing away from the substrate 1.

Step S106: the porous oxide film layer 4 and the first silicon planar layer are subjected to a first etching with $XeF_2$ vapor etching method.

$XeF_2$ has a very low efficiency in removing oxide. Thus, when $XeF_2$ gas passes through the porous oxide film layer 4 to etch the first silicon planar layer, the first silicon planar layer will be etched in an irregular manner. Therefore, the etched first silicon planar layer has a relatively great surface roughness. That is, the first silicon planar layer that has not been subjected to the first etching has a relatively smoother surface, while the first silicon planar layer that has been subjected to the first etching has a relatively rougher surface.

Step S107: the porous oxide film layer 4 is removed.

In some embodiment, the first silicon layer may be made of amorphous silicon. That is, the first crystalline silicon planar layer 31 is an amorphous silicon layer. Through the above steps S101 to S107, the manufactured silicon wafer is an amorphous silicon wafer.

The first silicon layer may be made of other silicon materials other than the amorphous silicon, such as monocrystalline silicon, polycrystalline silicon, and the like.

Figure 5:
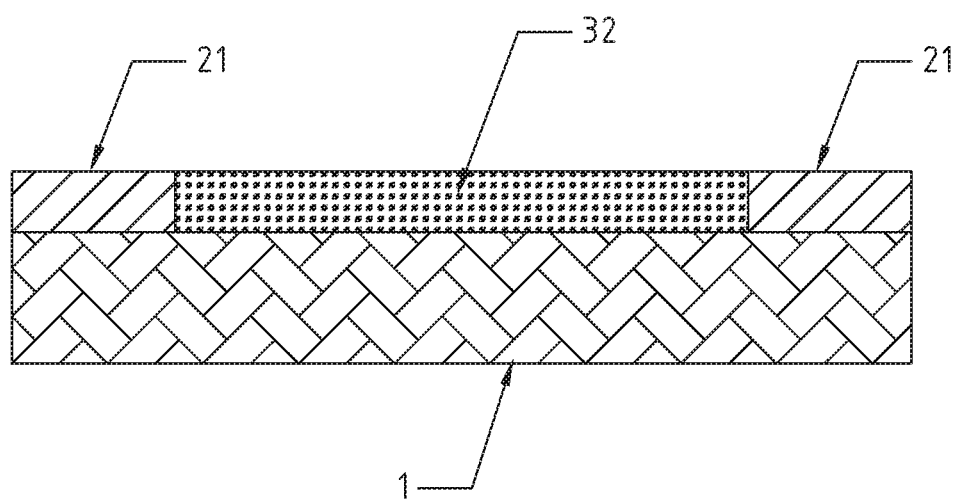
FIG. 5 is a structural schematic diagram of a silicon wafer prepared by the method shown in FIG. 1.

At this step S107, the preparation of the silicon wafer is completed, and the structural schematic diagram of the silicon wafer is shown in FIG. 5. The first silicon planar layer 32 that has been subjected to the first etching (as shown in FIG. 5) has a greater surface roughness than the silicon planar layer 31 shown in FIG. 3, i.e., a surface of the silicon wafer configured to contact other film layers has a higher roughness.

In the method for preparing a silicon wafer with a rough surface provided by the embodiment of the present invention, the porous oxide film layer 4 is deposited on the surface of the silicon that has been subjected to planar planarization and then the first silicon planar layer is subjected to the first etching with $XeF_2$ vapor etching method, during which $XeF_2$ gas passes through the porous oxide film layer 4 to etch the first silicon planar layer for the first time. Since $XeF_2$ has a very low efficiency in removing oxide, when $XeF_2$ gas passes through the porous oxide film layer 4 to etch the first silicon planar layer, the first silicon planar layer is etched in an irregular way. Therefore, the first silicon planar layer that has been subjected to the first etching has a greater surface roughness. That is, compared with the smoother surface of the first silicon planar layer that has not been subjected to the first etching, the surface of the first silicon planar layer that has been subjected to the first etching is taken as a rough surface. When the silicon wafer prepared by this method is applied to the MEMS device, the rough surface is maintained all the time. Therefore, when the silicon wafer is close to another film layer, the viscous force generated between two surfaces approaching each other is reduced, thereby improving the sensitivity of the MEMS device and reducing the probability of the out-of-work MEMS devices.

In some cases, the prepared silicon wafer, when to be used in a MEMS device, is required to be etched to form grooves before it is applied to the MEMS device. In these cases, the silicon wafer is required to be further etched to form these grooves. That is, following step S107, step S108 is further performed.

Figure 6:
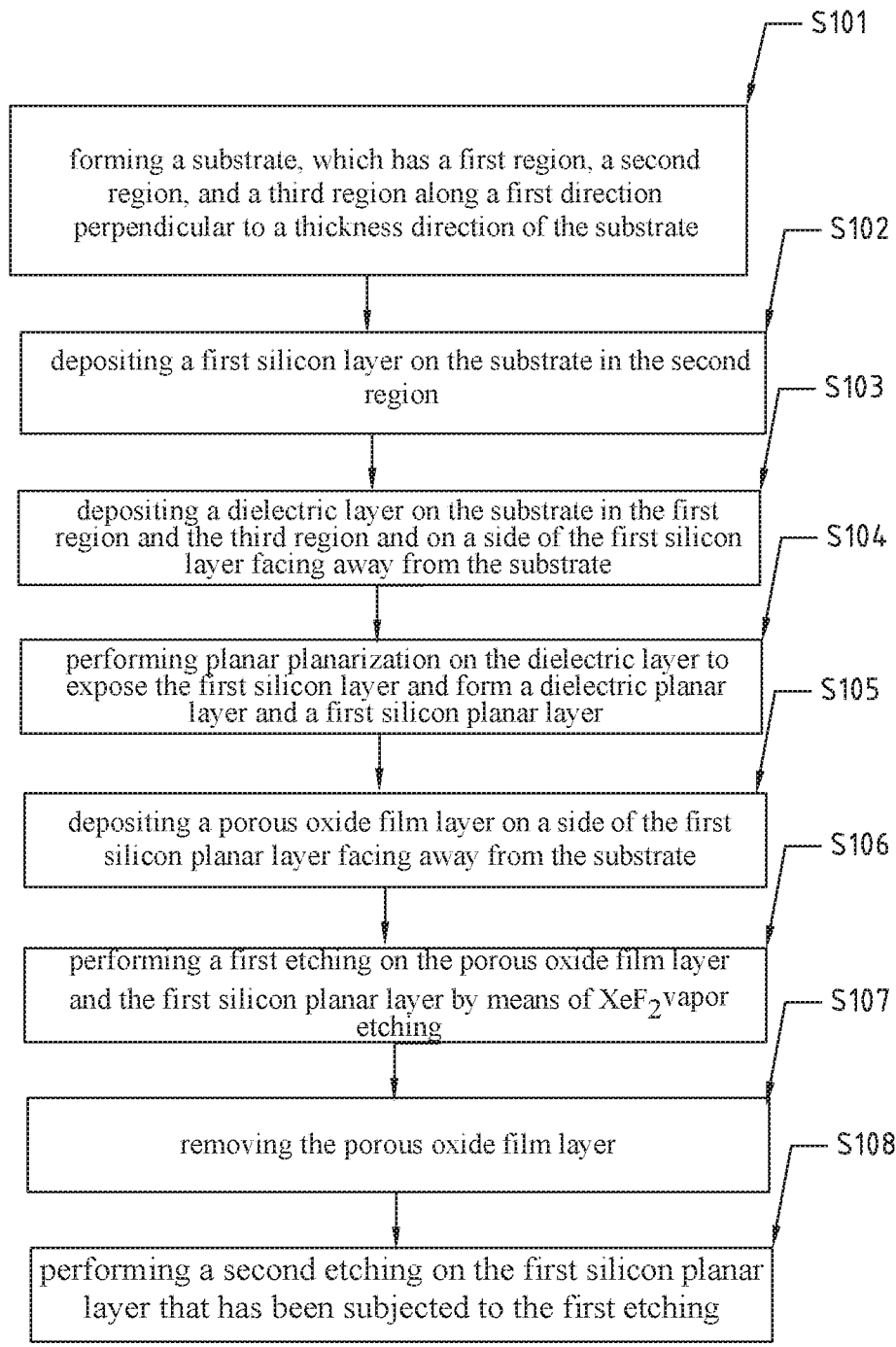
FIG. 6 is a flow diagram of a method for preparing a silicon wafer with a rough surface according to another embodiment of the present invention.
Figure 7:
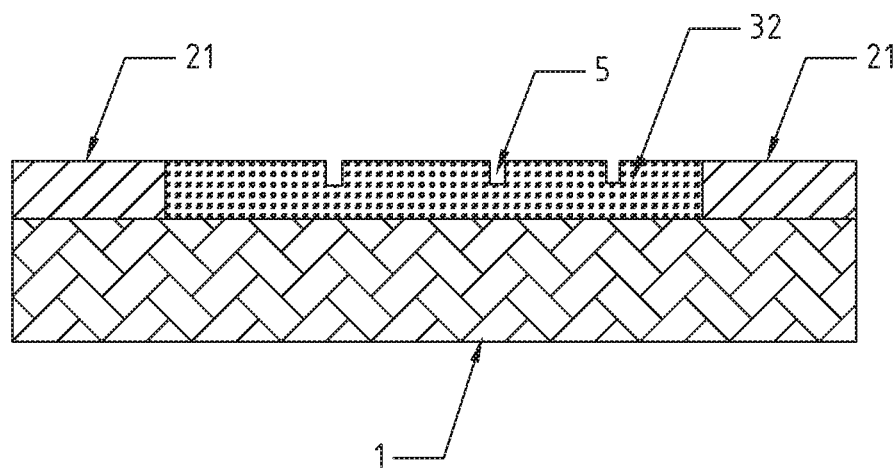
FIG. 7 is a structural schematic diagram of a silicon wafer prepared by the method shown in FIG. 6.

Step S108: the first silicon planar layer 32 that has been subjected to the first etching is further subjected to a second etching to form grooves and protrusions on a surface, facing away from the substrate, of the first silicon planar layer 32 that has been subjected to the first etching. The protrusion is a portion between two adjacent grooves 5, as shown in FIG. 6. In the subsequent preparation of MEMS, the rough surface will be maintained all the time. Therefore, when the silicon wafer is close to another film layer, the viscous force generated between the two surfaces approaching to each other is reduced, thereby improving the sensitivity of the MEMS device and reducing the probability of the out-of-work MEMS devices.

In the step S106, the porous oxide film layer 4 and the first silicon planar layer are subjected to the first etching with $XeF_2$ vapor etching method, during which $XeF_2$ gas passes through the porous oxide film layer 4 to etch the first silicon planar layer for the first time, and $XeF_2$ has a very low efficiency in removing oxide. If the oxide film layer has a large thickness, it is difficult for the $XeF_2$ gas to pass through the porous oxide film layer 4, i.e., it is difficult to etch the first silicon planar layer. Therefore, in another embodiment of the present invention, the porous oxide film layer 4 has a smaller thickness than the first silicon planar layer 31, such that during the first etching, the $XeF_2$ gas can easily pass through the porous oxide film layer 4 to etch the first silicon planar layer for the first time, which reduces the process difficulty of the first etching.

In an embodiment of the present invention, the thickness of the porous oxide film layer 4 is 0.2 μm to 0.6 μm, and the thickness of the first silicon planar layer 31 is 2 μm to 4 μm. That is, the thickness of the porous oxide film layer 4 is much smaller than the thickness of the first silicon planar layer 31, i.e., the porous oxide film layer 4 deposited on the first silicon planar layer 31 is a thin film layer. Therefore, when the porous oxide film layer 4 and the first silicon planar layer are etched for the first time with the $XeF_2$ vapor etching method, $XeF_2$ gas can more easily pass through the porous oxide film layer 4 to irregularly etch the first silicon planar layer, thereby further reducing the process difficulty of the first etching.

In another embodiment of the present invention, the step S105 of depositing the porous oxide film layer 4 on the side of the first silicon planar layer 31 facing away from the substrate 1 specifically includes: chemically or physically depositing the porous oxide film layer 4 on the side of the first silicon planar layer 31 facing away from the substrate 1.

In an embodiment, a plasma-enhanced chemical vapor deposition method is used to deposit the porous oxide film layer 4 on the side of the first silicon planar layer 31 facing away from the substrate 1.

In an embodiment of the present invention, the step S104 of performing planar planarization on the dielectric layer and the first silicon layer specifically includes: performing chemical mechanical planarization (CMP) on the dielectric layer and the first silicon layer. After the CMP, the polished dielectric layer and the polished first silicon layer have an even and smooth thicknesses.

In an embodiment of the present invention, the step S108 specifically includes: subjecting the first silicon planar layer that has been subjected to the first etching to a second etching with ion etching or wet etching, to form grooves on a surface, facing away the substrate, of the first silicon planar layer that has been subjected to the first etching.

In an embodiment of the present invention, the step S107 of removing the porous oxide film layer 4 specifically includes: removing the porous oxide film layer 4 by dry etching or wet etching.

As another aspect of the present invention, an embodiment of the present invention provides a silicon wafer. The silicon wafer is prepared using the aforementioned method for preparing a silicon wafer with a rough surface. As shown in FIG. 5, the silicon wafer includes: a substrate 1, which has a first region, a second region, and a third region along a first direction perpendicular to a thickness direction of the substrate 1; a dielectric planar layer 21 disposed on the substrate 1 and located in the first region and the third regions; and a first silicon planar layer 32 disposed on the substrate 1 and located in the second region. The silicon wafer is prepared by the aforementioned method for preparing a silicon wafer with a rough surface. The silicon wafer provided by the embodiment of the present invention is prepared by a method, in which the porous oxide film layer 4 is deposited on the surface of the silicon that has been subjected to planar planarization and then the first silicon planar layer is etched for the first time by the $XeF_2$ vapor etching method, during which $XeF_2$ gas passes through the porous oxide film layer 4 to etch the first silicon planar layer for the first time. Since $XeF_2$ has a very low efficiency in removing oxide, when $XeF_2$ gas passes through the porous oxide film layer 4 to etch the first silicon planar layer, the first silicon planar layer is etched in an irregular way. Therefore, the first silicon planar layer that has been subjected to the first etching has a greater surface roughness. That is, compared with the smooth surface of the first silicon planar layer that has not been etched for the first time, the surface of the first silicon planar layer that has been subjected to the first etching is a rough surface. When this silicon wafer is applied to the MEMS device, the rough surface is maintained all the time. Therefore, when the silicon wafer is close to another film layer, the viscous force generated between two surfaces approaching each other is reduced, thereby improving the sensitivity of the MEMS device and reducing the probability of the out-of-work MEMS devices.

In an embodiment of the present invention, a plurality of grooves 5 is provided on the surface of the first silicon planar layer 32 facing away from the substrate 1, and a portion between two adjacent grooves 5 is the protrusion, as shown in FIG. 5. The surface of the first silicon plane layer 32 having the grooves 5 is also a rough surface, which is maintained all the time in the subsequent preparation of MEMS. Therefore, when the silicon wafer is close to another film layer, the viscous force generated between two surfaces approaching each other is reduced, thereby improving the sensitivity of the MEMS device and reducing the probability of the out-of-work MEMS devices.

The above are merely some preferred embodiments of the present invention, but are not intended to limit the scope of the present invention. Any modifications, equivalent replacements, improvements made within the principle of the present invention shall be included in the protection scope of the present invention.

What is claimed is:

1. A method for preparing a silicon wafer with a rough surface, comprising:
    forming a substrate, wherein the substrate has a first region, a second region, and a third region along a first direction, and the first direction is perpendicular to a thickness direction of the substrate;
    depositing a first silicon layer on the substrate in the second region;
    depositing a dielectric layer on the substrate in the first region and the third region and on a side of the first silicon layer facing away from the substrate;
    performing planar planarization on the dielectric layer to expose the first silicon layer and form a dielectric planar layer and a first silicon planar layer;
    depositing a porous oxide film layer on a side of the first silicon planar layer facing away from the substrate;
    performing a first etching on the porous oxide film layer and the first silicon planar layer by means of $XeF_2$ vapor etching; and
    removing the porous oxide film layer.

2. The method as described in claim 1, further comprising: after said removing the porous oxide film layer, performing a second etching on the first silicon planar layer that has been subjected to the first etching to form grooves on a surface, facing away from the substrate, of the first silicon planar layer.

3. The method as described in claim 1, wherein a thickness of the porous oxide film layer is smaller than a thickness of the first silicon planar layer.

4. The method as described in claim 3, wherein the thickness of the porous oxide film layer ranges from 0.05 μm to 0.6 μm, and the thickness of the first silicon planar layer ranges from 1 μm to 4 μm.

5. The method as described in claim 1, wherein said removing the porous oxide film layer comprises: removing the porous oxide film layer by dry etching or wet etching.

6. The method as described in claim 1, wherein said depositing the porous oxide film layer on the side of the first silicon planar layer facing away from the substrate comprise: chemically or physically depositing the porous oxide film layer on the side of the first silicon planar layer facing away from the substrate.

7. The method as described in claim 1, wherein said performing planar planarization on the dielectric layer and the first silicon layer comprises: performing chemical mechanical planarization on the dielectric layer and the first silicon layer.

8. The method as described in claim 2, wherein said performing a second etching on the first silicon planar layer that has been subjected to the first etching: performing ion etching or wet etching on the first silicon planar layer that has been subjected to the first etching.

9. A silicon wafer, comprising:
    a substrate, wherein the substrate has a first region, a second region, and a third region along a first direction, the first direction is perpendicular to a thickness direction of the substrate;
    a dielectric planar layer disposed on the substrate and located in the first region and the third region; and
    a first silicon planar layer disposed on the substrate and located in the second region,
    wherein the silicon wafer is prepared by the method for preparing a silicon wafer with a rough surface as described in claim 1.

* * * * *